United States Patent
Kiba et al.

(10) Patent No.: US 10,490,721 B2
(45) Date of Patent: Nov. 26, 2019

(54) LIGHT-EMITTING DEVICE AND ILLUMINATING APPARATUS

(71) Applicant: PANASONIC INTELLECTUAL PROPERTY MANAGEMENT CO., LTD., Osaka (JP)

(72) Inventors: Keiji Kiba, Osaka (JP); Hisaki Fujitani, Kyoto (JP); Toshifumi Ogata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/986,353

(22) Filed: May 22, 2018

(65) Prior Publication Data

US 2018/0351060 A1 Dec. 6, 2018

(30) Foreign Application Priority Data

Jun. 1, 2017 (JP) .................. 2017-109146

(51) Int. Cl.
| H01L 33/00 | (2010.01) |
| H01L 33/62 | (2010.01) |
| H01L 33/56 | (2010.01) |
| H01L 25/075 | (2006.01) |
| H01L 23/00 | (2006.01) |

(Continued)

(52) U.S. Cl.
CPC .............. *H01L 33/62* (2013.01); *H01L 24/49* (2013.01); *H01L 25/0753* (2013.01); *H01L 33/36* (2013.01); *H01L 33/38* (2013.01); *H01L 33/50* (2013.01); *H01L 33/54* (2013.01); *H01L 33/56* (2013.01); *F21S 8/026* (2013.01); *F21V 7/04* (2013.01); *F21V 29/773* (2015.01);

(Continued)

(58) Field of Classification Search
CPC ..... H01L 33/62; H01L 25/0753; H01L 33/56; H01L 33/60; H01L 33/504; H01L 21/823475; H01L 21/823871; H01L 33/50; H01L 33/54; H01L 24/49; H01L 33/38; H01L 33/36; F21V 29/773; F21V 7/04; F21Y 2115/10; F21S 8/026
See application file for complete search history.

(56) References Cited

U.S. PATENT DOCUMENTS 9,196,584 B2  11/2015 Ogata et al.
9,416,924 B2   8/2016 Abe et al.
(Continued)

FOREIGN PATENT DOCUMENTS

JP  2012-004519 A  1/2012
JP  2014-130923 A  7/2014

OTHER PUBLICATIONS

U.S. Appl. No. 16/025,599 to Toshifumi Ogata, filed Jul. 2, 2018.

*Primary Examiner* — Shouxiang Hu
(74) *Attorney, Agent, or Firm* — Greenblum & Bernstein, P.L.C.

(57) ABSTRACT

A light-emitting device includes: a substrate; a first light-emitting element row disposed on the substrate; a first wire disposed on the substrate and passing between two light-emitting elements adjacent in the first light-emitting element row; and a first bonding wire which has one end connected to one of the two light-emitting elements and another end connected to the other of the two light-emitting elements, and crosses over the first wire.

20 Claims, 11 Drawing Sheets

(51) Int. Cl.
  *H01L 33/50* (2010.01)
  *H01L 33/54* (2010.01)
  *H01L 33/38* (2010.01)
  *H01L 33/36* (2010.01)
  *F21S 8/02* (2006.01)
  *F21V 29/77* (2015.01)
  *F21V 7/04* (2006.01)
  *F21Y 115/10* (2016.01)
  *H01L 33/60* (2010.01)

(52) U.S. Cl.
  CPC ......... *F21Y 2115/10* (2016.08); *H01L 33/504* (2013.01); *H01L 33/60* (2013.01)

(56) References Cited

U.S. PATENT DOCUMENTS

| | | | |
|---|---|---|---|
| 9,812,495 B2 | 11/2017 | Kiba | |
| 2008/0099772 A1* | 5/2008 | Shuy | H01L 27/156 257/88 |
| 2011/0278605 A1 | 11/2011 | Agatani et al. | |
| 2014/0085884 A1* | 3/2014 | Horio | H01L 25/0753 362/235 |
| 2015/0176820 A1* | 6/2015 | Abe | F21V 9/08 362/235 |
| 2015/0359088 A1* | 12/2015 | Konishi | H01L 33/62 257/98 |
| 2017/0040506 A1* | 2/2017 | Abe | H01L 33/507 |
| 2018/0219147 A1 | 8/2018 | Ogata et al. | |

\* cited by examiner

LIGHT-EMITTING DEVICE AND ILLUMINATING APPARATUS

CROSS REFERENCE TO RELATED APPLICATION

This application claims the benefit of priority of Japanese Patent Application Number 2017-109146 filed on Jun. 1, 2017, the entire content of which is hereby incorporated by reference.

BACKGROUND

1. Technical Field

The present disclosure relates to a light-emitting device and an illuminating apparatus using the light-emitting device.

2. Description of the Related Art

Light-emitting devices (light-emitting modules) having a chip-on-board (COB) structure in which light-emitting diode (LED) chips mounted on a substrate are sealed by a sealant formed by a resin containing phosphor are conventionally known. Japanese Unexamined Patent Application Publication No. 2012-4519 discloses a light-emitting device that allows for easy chromaticity adjustment.

SUMMARY

In light-emitting devices, when a plurality of light-emitting elements, which are collectively caused to emit light by applying voltage to a positive electrode terminal and a negative electrode terminal, are disposed in separate areas on a substrate, there are cases where electrically connecting the plurality of light emitting elements is difficult.

The present disclosure provides a light-emitting device and an illuminating apparatus in which electrically connecting a plurality of light-emitting elements is easy.

A light-emitting device according to an aspect of the present disclosure includes: a substrate; a first light-emitting element row disposed on the substrate; a first wire disposed on the substrate and passing between two light-emitting elements adjacent in the first light-emitting element row; and a first bonding wire having one end connected to one of the two light-emitting elements and another end connected to the other of the two light-emitting elements, the first bonding wire crossing over the first wire.

An illuminating apparatus according to an aspect of the present disclosure includes the above-described light-emitting device; and a lighting device that supplies power for causing the light-emitting device to emit light.

The present disclosure realizes a light-emitting device and an illuminating apparatus in which electrically connecting a plurality of light-emitting elements is easy.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENT

Hereinafter, exemplary embodiments will be described with reference to the drawings. It should be noted that each of the exemplary embodiments described below represents a generic or specific example. The numerical values, shapes, materials, structural components, the arrangement and connection of the structural components, etc. shown in the subsequent exemplary embodiments are mere examples, and are not intended to limit the scope of the present invention. Furthermore, among the structural components in the subsequent exemplary embodiments, components not recited in any one of the independent claims which indicate the broadest concepts are described as arbitrary structural components.

It should be noted that the respective figures are schematic diagrams and are not necessarily precise illustrations. Furthermore, in the respective figures, substantially identical components are assigned the same reference signs, and overlapping description may be omitted or simplified.

Furthermore, there are instances where coordinate axes are illustrated in the figures used to describe the subsequent exemplary embodiments. The Z-axis direction in the coordinate axes is for example the vertical direction, the Z-axis positive side is referred to as the top side (above/upward) and the Z-axis negative side is referred to as the bottom side (below/downward). In other words, the Z-axis direction is a direction perpendicular to a substrate included in a light-emitting device. Furthermore, the X-axis direction and the Y-axis direction are mutually orthogonal directions in a plane (horizontal plane) perpendicular to the Z-axis direction. The X-axis direction is an example of a first direction, and the Y-axis direction is an example of a second direction that crosses the first direction. An X-Y plane is a plane parallel to a principal face of the substrate included in the light-emitting device. For example, in the subsequent exemplary embodiments, "plan view" means viewing from the Z-axis direction.

Embodiment 1

[Configuration of Light-Emitting Device]

Figure 1:
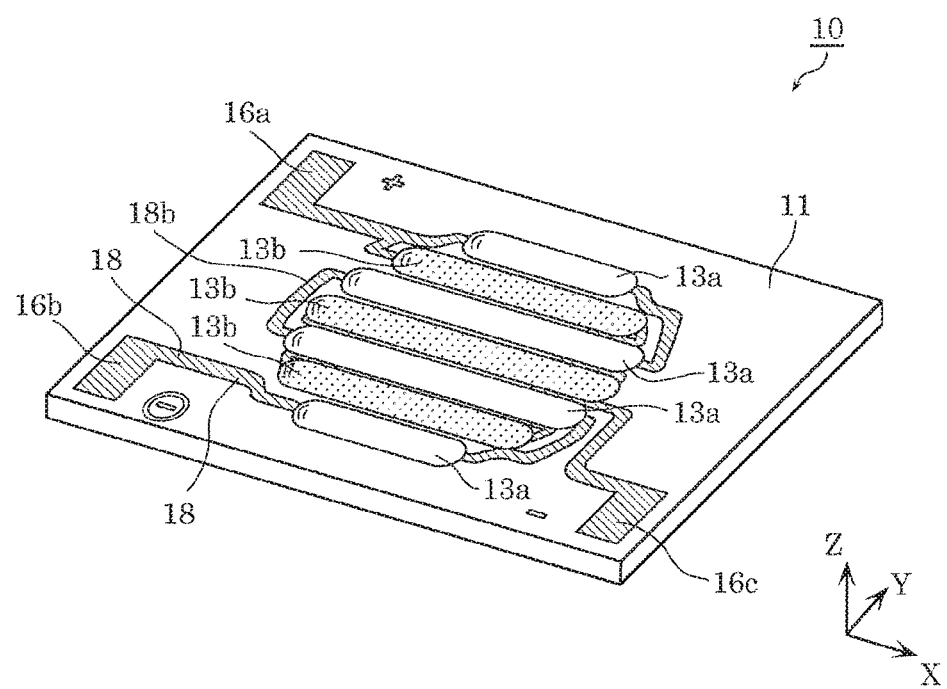
FIG. 1 is an external perspective view of a light-emitting device according to Embodiment 1.
Figure 2:
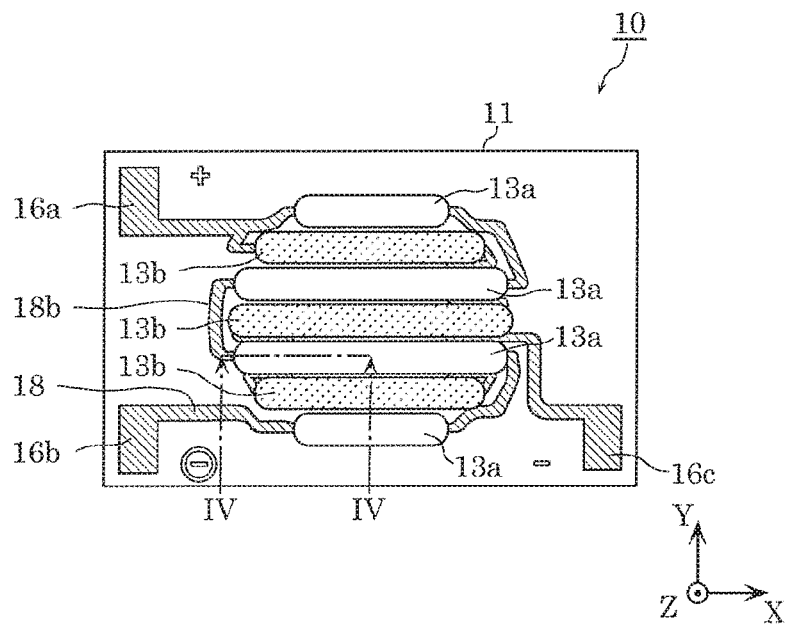
FIG. 2 is a plan view of the light-emitting device according to Embodiment 1.
Figure 3:
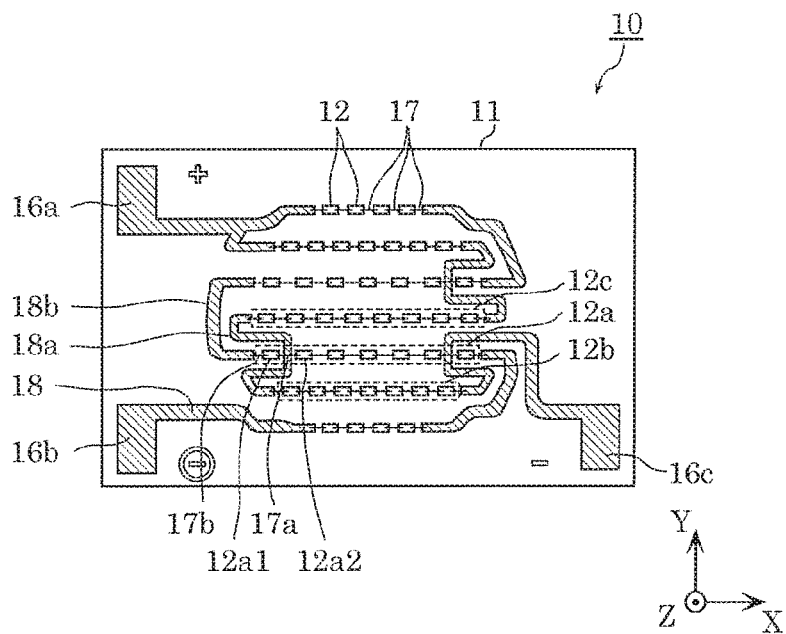
FIG. 3 is a plan view illustrating the internal structure of the light-emitting device according to Embodiment 1.
Figure 4:
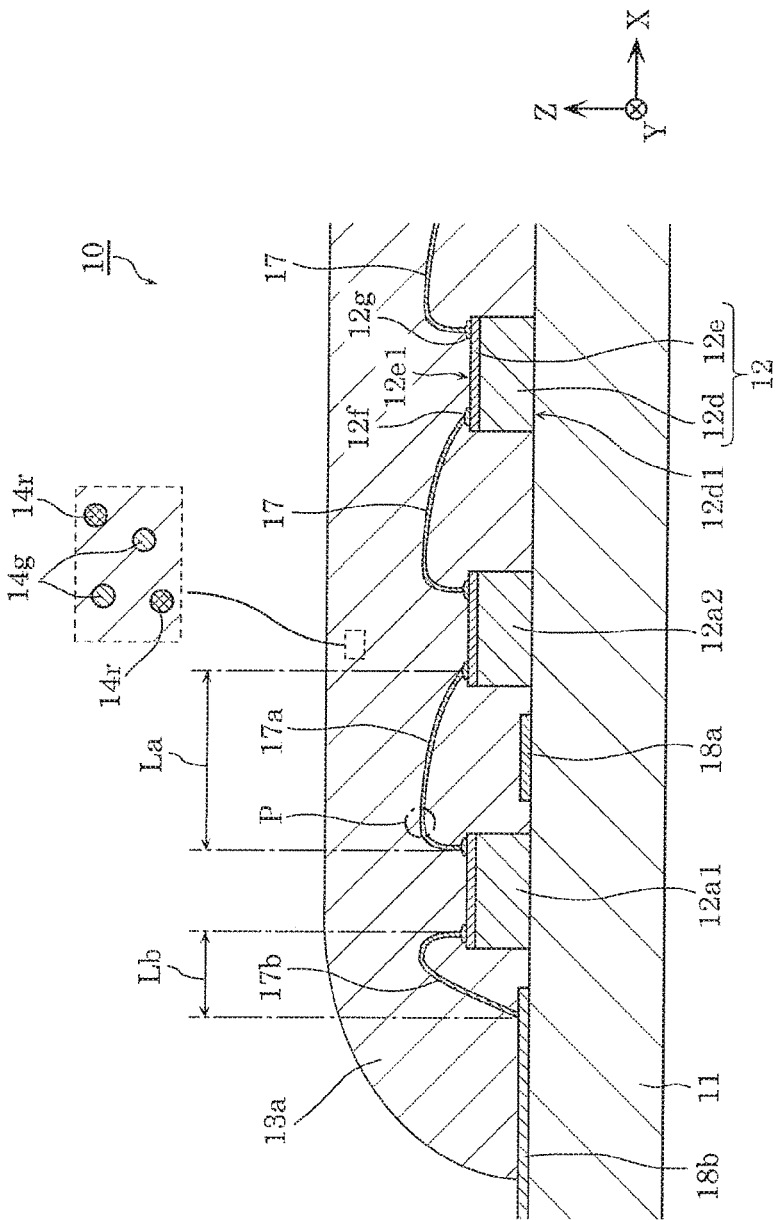
FIG. 4 is a schematic cross-sectional view along IV-IV in FIG. 2.

First, the configuration of a light-emitting device according to Embodiment 1 will be described with reference to the drawings. FIG. 1 is an external perspective view of the light-emitting device according to Embodiment 1. FIG. 2 is a plan view of the light-emitting device according to Embodiment 1. FIG. 3 is a plan view illustrating the internal structure of the light-emitting device according to Embodiment 1. FIG. 4 is a schematic cross-sectional view along line IV-IV in FIG. 2. It should be noted that FIG. 3 is a plan view in which first sealant 13a and second sealant 13b in FIG. 2 have been removed to illustrate the internal structure such as the arrangement and wiring pattern of LED chips 12.

As illustrated in FIG. 1 to FIG. 4, light-emitting device 10 according to Embodiment 1 includes substrate 11, a plurality of LED chips 12, first sealant 13a, second sealant 13b, first electrode 16a, second terminal 16b, third terminal 16c, a plurality of bonding wires 17, and wire 18. The plurality of bonding wires 17 include bonding wire 17a, bonding wire 17b, etc. Wire 18 includes first wire 18a, second wire 18b, etc.

Light-emitting device 10 is an LED module which has a COB structure in which the plurality of LED chips 12 are directly mounted on substrate 11, and emits white light. Light-emitting device 10 is a light-emitting device on which toning can be performed. When direct current power is supplied between first terminal 16a and second terminal 16b, white light of a first color temperature is emitted from first sealant 13a, and when direct current power is supplied between first terminal 16a and third terminal 16c, white light of a second color temperature is emitted from second sealant 13b. By controlling the direct current power supplied between first terminal 16a and second terminal 16b and the direct current power supplied between first terminal 16a and third terminal 16c, the color temperature of the white light emitted by light-emitting device 10 is changed between the first color temperature and the second color temperature range.

[Substrate]

First, the configuration of substrate 11 will be described. Substrate 11 is a substrate on which the plurality of LED chips 12 are disposed. Substrate 11 is, for example, a metal-based substrate or a ceramic substrate. Furthermore, substrate 11 may be a resin substrate having resin as a base material.

As a ceramic substrate, an alumina substrate comprising aluminum oxide (alumina) or an aluminum nitride substrate comprising aluminum nitride, etc. is used. Furthermore, as a metal-based substrate, for example, an aluminum alloy substrate, a ferroalloy substrate, or a copper alloy substrate, etc., on the surface of which an insulating film is formed is used. As a resin substrate, for example, a glass-epoxy substrate comprising glass fiber and epoxy resin, etc. is used.

It should be noted that, as substrate 11, a substrate having high optical reflectance (for example, an optical reflectance of at least 90%) may be used. By using a substrate having high optical reflectance for substrate 11, the light emitted by LED chips 12 can be reflected off the surface of substrate 11. As a result, the light-extraction efficiency of light-emitting device 10 is improved. Such a substrate is exemplified by a white ceramic substrate having, for example, alumina as a base material.

Furthermore, as substrate 11, a light transmissive board that is highly transmissive of light may be used. Such a substrate is exemplified by a light-transmissive ceramic substrate formed from polycrystalline alumina or aluminum nitride, a transparent glass substrate formed from glass, a crystal substrate formed from crystal, a sapphire substrate formed from sapphire, or a transparent resin substrate formed from a transparent resin material.

It should be noted that substrate 11 is quadrangular (rectangular) in a plan view, but may be another shape such as circular, etc.

[LED Chip and Light-Emitting Element Row]

The plurality of LED chips 12 are disposed on substrate 11. LED chips 12 are an example of light-emitting elements. LED chips 12 are, for example, blue LED chips which are formed from a InGaN-based material and have a light-emission spectrum peak wavelength of at least 430 nm and at most 480 nm. Specifically, LED chips 12 emit blue light. Each of LED chips 12 on substrate 11 emits light mainly upward (Z-axis positive direction).

As illustrated in FIG. 4, LED chip 12 has a structure in which light emission layer 12e is disposed on base substrate 12d. Base substrate 12d is for example a substrate having an insulating property such as a sapphire substrate. Light emission layer 12e is for example a nitride semiconductor layer formed from a InGaN-based material.

Furthermore, LED chip 12 has first face 12d1 facing substrate 11, second face 12e1 on the side opposite to first face 12d1, and anode 12f and cathode 12g which are disposed on second face 12e1. In other words, LED chip 12 has a single-sided electrode structure.

In light-emitting device 10, the plurality of LED chips 12 are divided into seven light-emitting element rows. Each of the seven light-emitting element rows are configured by arranging a plurality of LED chips 12 in straight lines. Each of the seven light-emitting rows is specifically configured by arranging a plurality of LED chips 12 side by side along the X-axis direction at equal intervals. Furthermore, the seven light-emitting element columns are arranged side by side in the Y-axis direction crossing (orthogonal to) the X-axis direction. LED chips 12 included in a single light-emitting element row are connected in series, chip-to-chip, by bonding wires 17. LED chip 12 located at an endmost position in one light-emitting element row is connected to wire 18 disposed on substrate 11 by bonding wire 17.

The seven light-emitting element rows, as a whole, form a substantially circular light emission area. Four light-emitting element rows out of the seven light-emitting element rows are sealed by first sealant 13a. The four light-emitting element rows sealed by first sealant 13a are connected in series. The other three light-emitting element rows out of the seven light-emitting element rows are sealed by second sealant 13b. The three light-emitting element rows sealed by second sealant 13b are connected in series. In the Y-axis direction, first sealant 13a and second sealant 13b are arranged alternately. In other words, in the Y-axis direction, light-emitting element rows sealed by first sealant 13a and light-emitting element rows sealed by second sealant 13b are arranged alternately.

Such seven light-emitting element rows include first light-emitting element row 12a, second light-emitting element row 12b, and third light-emitting element row 12c. First light-emitting element row 12a, second light-emitting element row 12b, and third light-emitting element row 12c are arranged side-by-side in the Y-axis direction crossing (orthogonal to) the X-axis direction, first light-emitting element row 12a is located between second light-emitting element row 12b and third light-emitting element row 12c.

[Sealant]

Next, first sealant 13a and second sealant 13b will be described. First, first sealant 13a will be described. First sealant 13a seals, for example, first light-emitting element row 12a in a straight line along the X-axis direction. As illustrated in FIG. 4, first sealant 13a specifically seals first light-emitting element row 12a, bonding wires 17 (including bonding wire 17a and bonding wire 17b), part of first wire 18a, and part of second wire 18b. First sealant 13a has a function of protecting first light-emitting element row 12a, bonding wires 17, part of first wire 18a, and part of second wire 18b from dust, moisture, outside force, etc.

First sealant 13a is formed from a light-transmissive resin material (base material) containing phosphors. The base material of first sealant 13a is for example a methyl-based silicone resin, but may be an epoxy resin or a urea resin, etc.

First sealant 13a, for example, contains green phosphor 14g and red phosphor 14r. Specifically, green phosphor 14g is, for example, an yttrium aluminum garnet (YAG)-based phosphor having a light emission peak wavelength of at least 550 nm and at most 570 nm or a or a $Lu_3Al_5O_{12}:Ce^{3+}$ phosphor having a light emission peak wavelength of at least 540 nm and at most 550 nm. Specifically, red phosphor 14r is, for example, a $CaAlSiN_3:Eu^{2+}$ phosphor which has a light emission peak wavelength of at least 610 nm and at most 620 nm or a $(Sr, Ca) AlSiN_3:Eu^{2+}$ phosphor, etc.

There is no particular limitation on the phosphor that contained in first sealant 13a. It is sufficient that first sealant 13a contains a phosphor that emits light when excited by the light emitted by LED chips 12. Furthermore, first sealant 13a may contain a filler. The filler is, for example, silica having a grain size of approximately 10 nm. By containing a filler, the filler provides resistance to prevent the phosphor from settling. Accordingly, the phosphor can be disposed in a uniformly dispersed manner inside first sealant 13a.

When LED chips 12 included in first light-emitting element row 12a emit blue light, part of the blue light that is emitted is wavelength-converted into green light by green phosphor 14g contained in first sealant 13a. Furthermore, part of the blue light that is emitted is wavelength-converted into red light by red phosphor 14r contained in first sealant 13a. Then, the blue light that is not absorbed by green phosphor 14g and red phosphor 14r, the green light from the wavelength-conversion by green phosphor 14g, and the red light from the wavelength-conversion by red phosphor 14r are diffused and mixed inside first sealant 13a. Accordingly, white light having the first color temperature is emitted from first sealant 13a. Specifically, white light having the first color temperature is emitted from first sealant 13a when first light-emitting element row 12a emits light.

The first color temperature is set to, for example, 2700 K by adjusting the amount of green phosphor 14g and red phosphor 14r contained in first sealant 13a (i.e., the content percentage of green phosphor 14g and red phosphor 14r in first sealant 13a).

Next, second sealant 13b will be described. Second sealant 13b seals, for example, each of second light-emitting element row 12b and third light-emitting element row 12c in a straight line along the X-axis direction. Specifically, second sealant 13b seals, aside from a plurality of LED chips 12, bonding wires 17 and part of wire 18. Second sealant 13b has a function of protecting the plurality of LED chips 12, bonding wires 17, and part of wire 18 from dust, moisture, outside force, etc.

Like first sealant 13a, second sealant 13b is thrilled from a light-transmissive resin material (base material) containing phosphors. The base material of second sealant 13b is for example a methyl-based silicone resin, but may be an epoxy resin or a urea resin, etc.

Second sealant 13b, for example, contains green phosphor 14g and red phosphor 14r. There is no particular limitation on the phosphor contained in second sealant 13b. It is sufficient that second sealant 13b contains a phosphor that emits light when excited by the light emitted by LED chips 12. Furthermore, second sealant 13b may contain a filler.

When LED chips 12 included in second light-emitting element row 12b or third light-emitting element row 12c emit blue light, part of the blue light that is emitted is wavelength-converted into green light by green phosphor 14g contained in second sealant 13b. Furthermore, part of the blue light that is emitted is wavelength-converted into red light by red phosphor 14r contained in second sealant 13b. Then, the blue light that is not absorbed by green phosphor 14g and red phosphor 14r, the green light from the wavelength-conversion by green phosphor 14g, and the red light from the wavelength-conversion by red phosphor 14r are diffused and mixed inside second sealant 13b. Accordingly, white light having the second color temperature is emitted from second sealant 13b. Specifically, white light having the second color temperature is emitted from second sealant 13b when second light-emitting element row 12b or third light-emitting element row 12c emits light.

The second color temperature is different from the first color temperature. The second color temperature is set to, for example, 8000 K by adjusting the amount of green phosphor 14g and red phosphor 14r contained in second sealant 13b (i.e., the content percentage of green phosphor 14g and red phosphor 14r in second sealant 13b). It should be noted that, in consideration to the toning-possible color temperature range, the first color temperature and the second temperature may be different by at least 1000 K, for example.

[Terminal, Wire, and Bonding Wire]

Next, terminals disposed on substrate 11 will be described. As power supply terminals for supplying power from the outside to light-emitting device 10, first terminal 16a, second terminal 16b, and third terminal 16c are disposed on substrate 11. First terminal 16a, second terminal 16b, and third terminal 16c are for example disposed in 3 places out of the four corners of substrate 11.

First terminal 16a, second terminal 16b, and third terminal 16c are terminals for supplying power to the plurality of LED chips 12. First terminal 16a is a positive electrode terminal that is used in common, and second terminal 16b and third terminal 16c are negative electrode terminals.

When direct current power is supplied between first terminal 16a and second terminal 16b, light-emitting element rows sealed by first sealant 13a, such as first light-emitting element row 12a, emit light. When direct current power is supplied between first terminal 16a and third terminal 16c, light-emitting element rows sealed by second sealant 13b, such as second light-emitting element row 12b and third light-emitting element row 12c, emit light. Specifically, independent light emission control can be performed on the light-emitting element rows sealed by first sealant 13a and the light-emitting element rows sealed by second sealant 13b by using the three terminals, first terminal 16a, second terminal 16b, and third terminal 16c.

It should be noted that first terminal 16a may be a negative electrode terminal that is used in common. Second terminal 16b and third terminal 16c are positive electrode terminals. Furthermore, light-emitting device 10 need not include a commonly-used terminal, and independent light emission control can be performed on the light-emitting element rows sealed by first sealant 13a and the light-emitting element rows sealed by second sealant 13b by using four terminals, for example.

It should be noted that the number of LED chips 12 included in the light-emitting element rows sealed by first sealant 13a and the number of LED chips 12 included in the light-emitting element rows sealed by second sealant 13b are the same. Specifically, the number of LED chips 12 connected in series between first terminal 16a and second terminal 16b, and the number of LED chips 12 connected in series between first terminal 16a and third terminal 16c are the same.

Therefore, the voltage to be applied between first terminal 16a and second terminal 16b and the voltage to be applied between first terminal 16a and third terminal 16c may be equal. Accordingly, the same type of lighting device (lighting circuit) as the lighting device that applies voltage between first terminal 16a and second terminal 16b may be applied to the lighting device that applies voltage between first terminal 16a and third terminal 16c. In other words, the two lighting devices can have a common configuration.

Furthermore, wire 18 for electrically connecting the plurality of LED chips 12 is disposed on substrate 11. For example, first wire 18a, which electrically connects second light-emitting element row 12b and third light-emitting element row 12c, is disposed on substrate 11. First wire 18a passes between LED chip 12a1 and LED chip 12a2 which are two LED chips 12 included in first light-emitting element row 12a. Furthermore, second wire 18b, which electrically connects first light-emitting element row 12a and other light-emitting element rows covered by first sealant 13a other than first light-emitting element row 12a, is disposed on substrate 11.

Furthermore, the plurality of LED chips 12 included on the light-emitting element rows on substrate 11 are connected, chip-to-chip, by bonding wires 17. Specifically, one end of bonding wire 17 is connected to the cathode of one of two adjacent LED chips 12, and the other end of bonding wire 17 is connected to the anode of the other of the two adjacent LED chips 12.

For example, bonding wire 17a has one end connected to LED chip 12a1 and another end connected to LED chip 12a2. Furthermore, bonding wire 17b has one end connected to LED chip 12a1 located at an endmost position among LED chips 12 included in first light-emitting element row 12a, and another end connected to second wire 18b disposed on substrate 11.

The above-described terminals (first terminal 16a, second terminal 16b, and third terminal 16c), wire 18 (first wire 18a and second wire 18b), and bonding wires 17 (bonding wire 17a and bonding wire 17b) are, for example, formed from a metal material such as gold (Au), silver (Ag), or copper (Cu).

It should be noted that the terminals and wire 18 are integrally formed by patterning on substrate 11. In light-emitting device 10, the terminals and wire 18 on substrate 11 are not covered by an insulating film such as a cover resist, etc. However, except for portions that need to be exposed, the terminals and wire 18 on substrate 11 may covered by an insulating film such as a cover resist.

[Three-Dimensional Crossing of Bonding Wire and Wire]

In order to electrically connect the plurality of LED chips 12, there are cases where bonding wires 17 and wire 18 are three-dimensionally crossed above substrate 11. Such three-dimensional crossing is particularly useful when substrate 11 is a single-layer substrate that has only one wiring layer.

Figure 5:
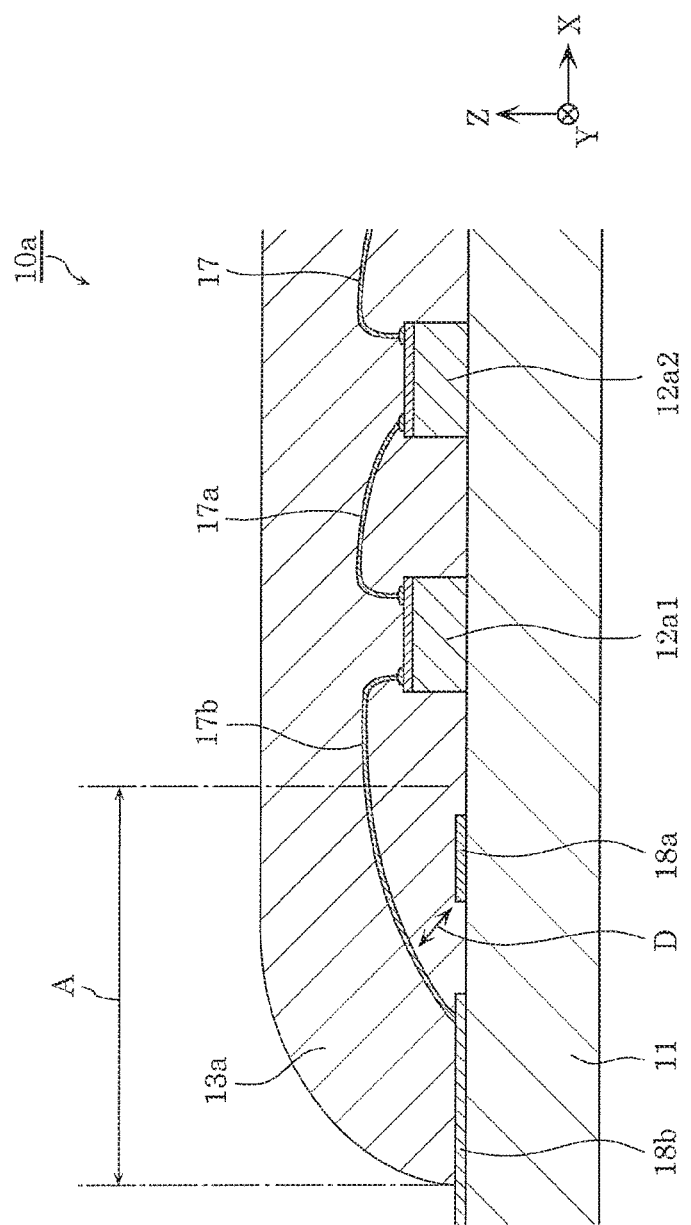
FIG. 5 is a schematic cross-sectional view of a light-emitting device in a comparative example.

As illustrated in FIG. 4, in light-emitting device 10, bonding wire 17a, which electrically connects LED chip 12a1 and LED chip 12a2, which are two adjacent LED chips 12, crosses over first wire 18a. In other words, first wire 18a passes below bonding wire 17a. The advantageous effects that can be obtained with such a configuration will be described, with reference to a light-emitting device according to a comparative example. FIG. 5 is a schematic cross-sectional view of a light-emitting device in a comparative example.

In light-emitting device 10a according to the comparative example illustrated in FIG. 5, bonding wire 17b, which electrically connects LED chip 12a1 and second wire 18b, crosses over first wire 18a. In this case, since second wire 18b is thinner compared to LED chip 12, there are cases where first wire 18a and bonding wire 17b come close to each other. Specifically, there are cases where distance D in FIG. 5 becomes short. Specifically, maintaining insulation between first wire 18a and bonding wire 17b becomes a problem. It should be noted that the thickness of second wire 18b is, for example, approximately 20 μm, and the thickness of LED chip 12 is, for example, approximately 200 μm.

In contrast, in light-emitting device 10, bonding wire 17a, which electrically connects LED chip 12a1 and LED chip 12a2, crosses over first wire 18a. In this case, since each of LED chip 12a1 and LED chip 12a2 is thicker than second wire 18b (wire 18), first wire 18a and bonding wire 17a are prevented from coming close to each other, and thus maintaining insulation between first wire 18a and bonding wire 17a becomes easy.

Furthermore, since bonding wire 17b crosses over first wire 18a in light-emitting device 10a according to the comparative example, bonding wire 17b becomes long. As such, insufficiently bright region A (dark region A) formed at the end portion of first sealant 13a becomes relatively big, and thus poses a problem. When region A becomes big, luminance unevenness may occur in the illumination area of the illuminating apparatus including light-emitting device 10a.

In contrast, in light-emitting device 10, the total length of bonding wire 17b is shorter than the total length of bonding wire 17a. Furthermore, in light-emitting device 10, length Lb of bonding wire 17b in the X-axis direction is shorter than length La of bonding wire 17a in the X-axis direction, in a plan view. Specifically, in light-emitting device 10, by making bonding wire 17b short, the insufficiently bright area (dark area) formed at the end portion of first sealant 13a can be reduced.

It should be noted that, since first wire 18a absorbs light, the light-extraction efficiency from light-emitting device 10 may deteriorate if first wire 18a is disposed near the center of first light-emitting element row 12a in the X-axis direction. In view of this, in light-emitting device 10, first wire 18a is disposed between LED chip 12a1 located at an endmost position and LED chip 12a2 located at a second endmost position in first light-emitting element row 12a. Specifically, first wire 18a is disposed between the two LED chips 12 located at the end of first light-emitting element row 12a. With this, the deterioration of light-extraction efficiency from light-emitting device 10 can be reduced.

Furthermore, due to the bonding sequence of the ends of bonding wires portion of bonding wire 17 having the greatest height from the surface of substrate 11 is located at a bias. For example, when the end that is to be connected to LED chip 12a2 is bonded after the end to be connected to LED chip 12a1 is bonded, portion P of bonding wire 17a which has the greatest height from the surface of substrate 11 is located closer to LED chip 12a1 than to LED chip 12a2.

Figure 6:
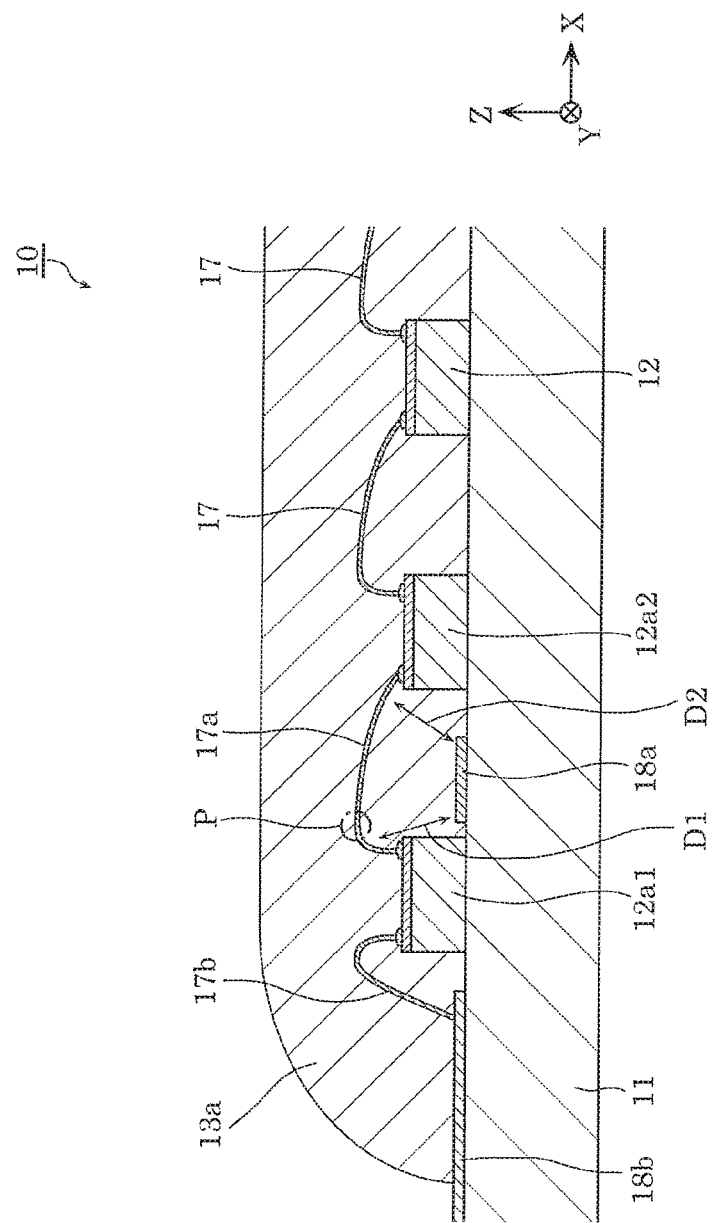
FIG. 6 is a schematic cross-sectional view for an example in which a first wire is disposed closer to one of two LED chips.

In such a case, first wire 18a may be located closer to LED chip 12a1 instead of in the middle between LED chip 12a1 and LED chip 12a2. FIG. 6 is a schematic cross-sectional view illustrating an example in which first wire 18a is disposed closer to LED chip 12a1.

As illustrated in FIG. 6, by disposing first wire 18a closer to LED chip 12a1, balance between distance D1 and distance D2 can be achieved, and thus insulation can be effectively maintained. It should be noted that distance D1 is the distance from portion P of bonding wire 17a having the greatest height from the surface of substrate 11 to first wire 18a. Distance D2 is the distance from the portion of bonding wire 17a which is closer to LED chip 12a2 and has a relatively low height from the surface of substrate 11 to first wire 18a.

It should be noted that first wire 18a is not limited to a wire that electrically connects second light-emitting element row 12b and third light-emitting element row 12c. First wire 18a may be, for example, a wire that electrically connects a light-emitting element row and a terminal on substrate 11.

[Variation]

Figure 7:
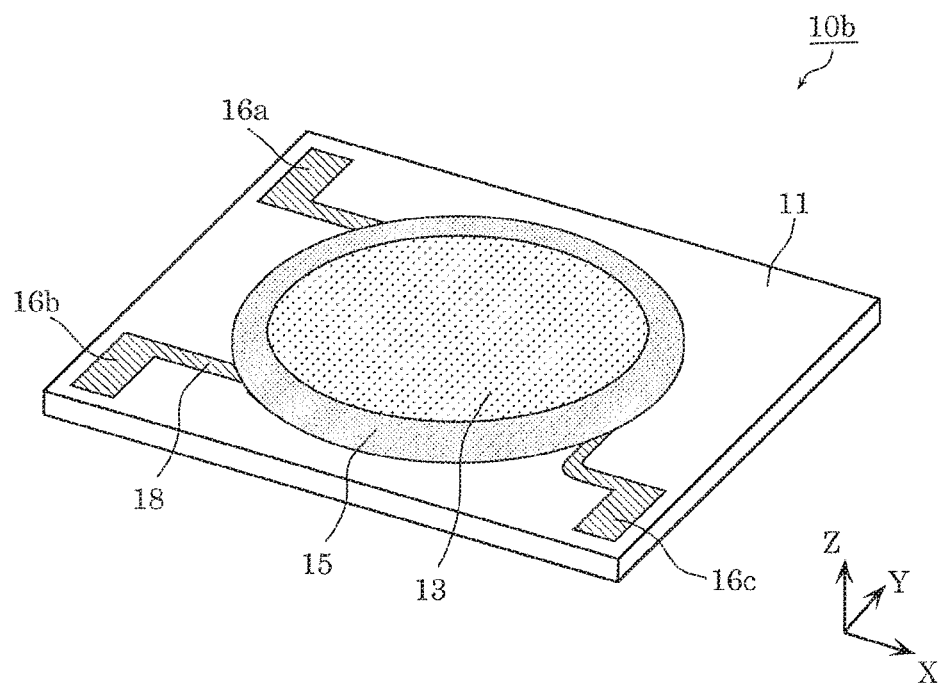
FIG. 7 is an external perspective view of a light-emitting device in which all LED chips on a substrate are collectively sealed.

In light-emitting device 10, the plurality of LED chips 12 disposed on substrate 11 are sealed by either one of first sealant 13a or second sealant 13b. However, all LED chips 12 disposed on substrate 11 may be collectively sealed by one type of sealant. FIG. 7 is an external perspective view of a light-emitting device in which all LED chips 12 on substrate 11 are collectively sealed.

Light-emitting device 10b illustrated in FIG. 7 includes sealant 13, and all LED chips 12 on substrate 11 are collectively sealed by sealant 13. Specifically, sealant 13 collectively seals first light-emitting element row 12a, second light-emitting element row 12b, and third light-emitting element row 12c. The wiring pattern and arrangement of the plurality of LED chips 12 on substrate 11 included in light-emitting device 10b are the same as in light-emitting device 10.

Like first sealant 13a and second sealant 13b, sealant 13 is formed from a light-transmissive resin material (base material) containing phosphors. The base material of sealant 13 is for example a methyl-based silicone resin, but may be an epoxy resin or a urea resin, etc.

Sealant 13, for example, contains green phosphor 14g and red phosphor 14r. There is no particular limitation on the phosphor contained in sealant 13. It is sufficient that sealant 13 contains a phosphor that emits light when excited by the light emitted by LED chips 12. Furthermore, sealant 13 may contain a filler.

Furthermore, light-emitting device 10b includes a plurality of LED chips 12 disposed on substrate 11, and annular component 15 surrounding sealant 13.

Furthermore, annular component 15 is a component that functions as a dam component for holding back sealant 13, and is disposed on substrate 11 earlier than sealant 13. Annular component 15 is in the shape of a circular ring, for example, but may be of another shape such as a rectangular ring, etc. For annular component 15, for example, a thermosetting resin or thermoplastic resin which has an insulating property is used. More specifically, silicone resin, phenol resin, epoxy resin, bismaleimide-triazine resin, or polyphthalamide (PPA), etc. is used for annular component 15.

In order to enhance the light-extraction efficiency from light-emitting device 10b, annular component 15 may be photoreflective. In view of this, a white-colored resin (what is called white resin) is used for annular component 15. It should be noted that, in order to enhance the photoreflectivity of annular component 15, annular component 15 may contain particles of $TiO_2$, $Al_2O_3$, $ZrO_2$, MgO, etc.

In above-described light-emitting device 10b, maintaining insulation between first wire 18a and bonding wire 17a is also facilitated by the configuration in which bonding wire 17a, which electrically connects LED chip 12a1 and LED chip 12a2, crosses over first wire 18a.

It should be noted that light-emitting device 10b has no toning function. In this manner, the present invention may be realized as a light-emitting device having no toning function. However, if blue LED chips 12 and red LED chips 12 are mixed among the plurality of LED chips 12 on substrate 11, it is possible to provide light-emitting device 10b with a toning function. Specifically, LED chips 12 emitting red light may be included so that the color temperature of light emitted when voltage is applied to first terminal 16a and second terminal 16b and the color temperature of light emitted when voltage is applied to first terminal 16a and third terminal 16c are different.

Figure 8:
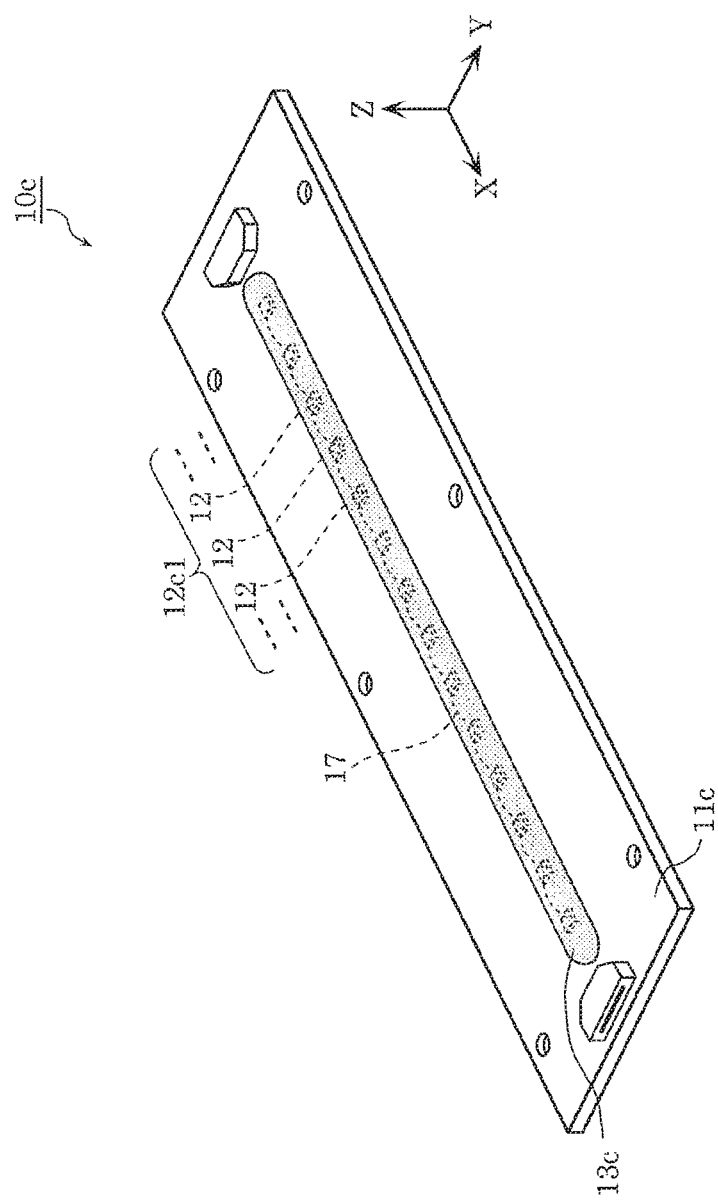
FIG. 8 is an external perspective view of a light-emitting device having a linear light emission area.

Furthermore, although light-emitting device 10 and light-emitting device 10b have substantially circular light emission areas, the present invention may be realized as a light-emitting device having a light emission area in a shape other than a circle. For example, the present invention may be realized as a light-emitting device having a rectangular light emission area or as a light-emitting device having a linear light emission area. FIG. 8 is an external perspective view of a light-emitting device having a linear light emission area.

Light-emitting device 10c illustrated in FIG. 8 includes an elongated substrate 11c, and first light-emitting element row 12c1 disposed on substrate 11c. The plurality of LED chips 12 included in first light-emitting element row 12c1 are electrically connected, chip-to-chip, by bonding wires 17.

In such light-emitting device 10c, maintaining insulation between wire (not illustrated in FIG. 8) and bonding wire 17 is also facilitated by having bonding wire 17, which electrically connects two LED chips 12, cross over the wire.

It should be noted that, in Embodiment 1, a light-emitting element row is configured by a plurality of LED chips 12 arranged side-by-side along a straight line. However, it is sufficient that a light-emitting element row be configured by a plurality of LED chips 12 arranged side-by-side, and the light-emitting element row may be formed by a plurality of LED chips 12 arranged side-by-side along a curved line.

Figure 9:
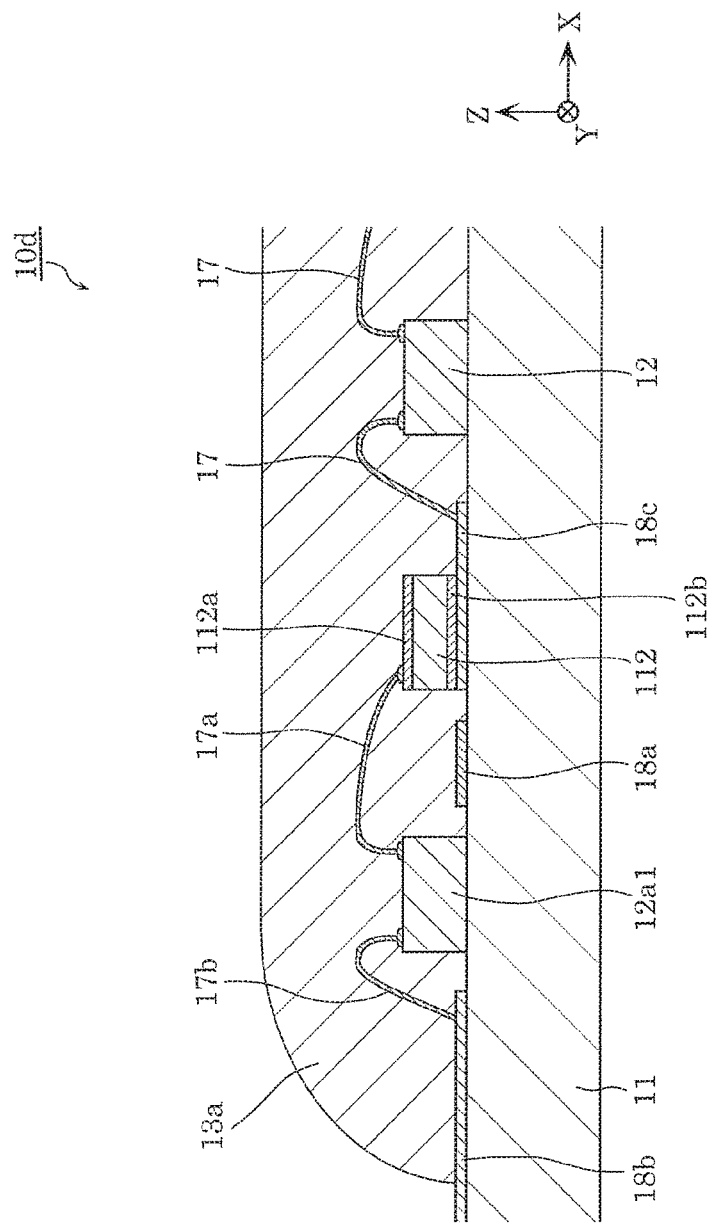
FIG. 9 is a first schematic cross-sectional view of a light-emitting device including LED chips having a double-sided electrode structure.

Furthermore, in light-emitting device 10, each of the plurality of LED chips 12 have a single-sided electrode structure. However, part or all of the plurality of LED chips 12 may be an LED chip having a double-sided electrode structure. In this ease, as illustrated in FIG. 9, bonding wire 17a that crosses over first wire 18a may have one end connected to LED chip 12a1 having a single-sided electrode structure and another end connected to LED chip 112 having a double-sided electrode structure. FIG. 9 is a schematic cross-sectional view of light-emitting device 10d including LED chip 112 having a double-sided electrode structure.

LED chip 112 having a double-sided electrode structure included in light-emitting device 10d includes upper electrode 112a and lower electrode 112b. In light-emitting device 10d, one end of bonding wire 17a is connected to the electrode of LED chip 12a1 having a single-sided electrode structure, and the other end of bonding wire 17a is connected to upper electrode 112a. Lower electrode 112b is electrically connected to wire 18c disposed on substrate 11 by a conductive material such as silver paste.

In such light-emitting device 10d, electrically connecting the plurality of LED chips is easy even though substrate 11 is a single layer substrate. It should be noted that, in light-emitting device 10d, the distance between first wire 18a and wire 18c is determined such that insulation between first wire 18a and wire 18c is maintained. For example, first wire 18a is disposed closer to LED chip 12a1.

Figure 10:
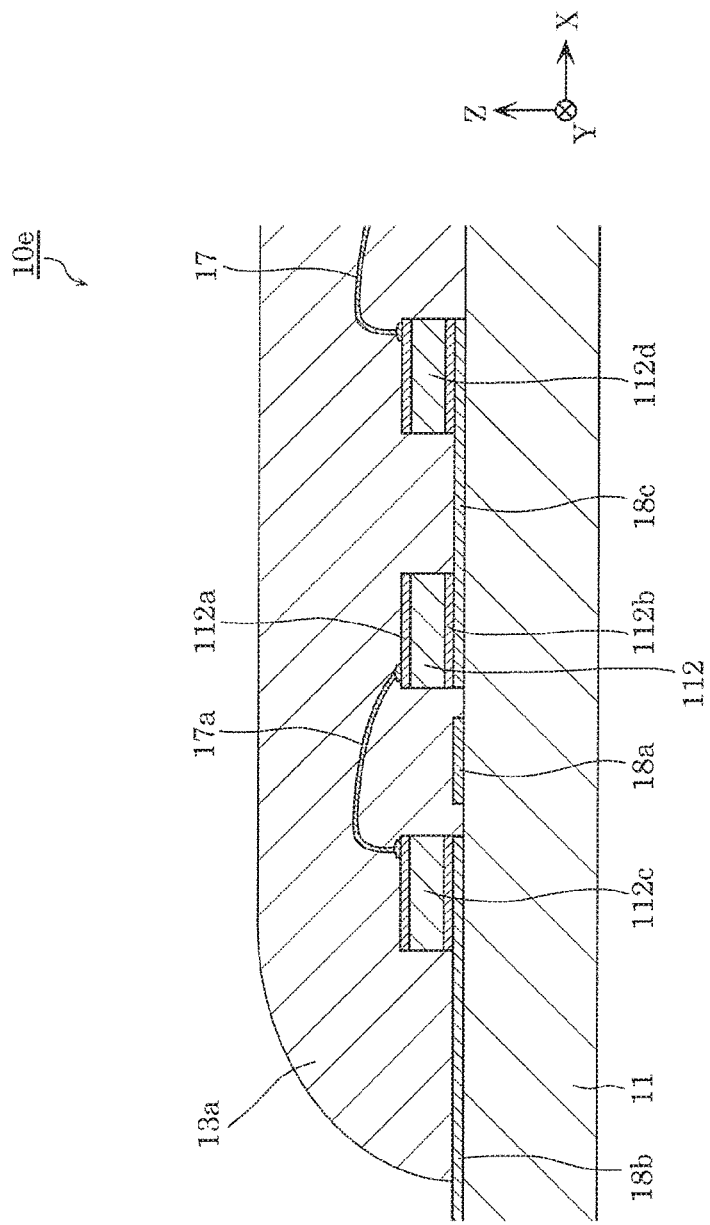
FIG. 10 is a second schematic cross-sectional view of a light-emitting device including LED chips having a double-sided electrode structure.

Furthermore, as illustrated in FIG. 10, both ends of bonding wire 17a, which crosses over first wire 18a, may be connected to LED chips (LED chip 112 and LED chip 112c) having a double-sided electrode structure. FIG. 10 is a schematic cross-sectional view of light-emitting device 10e including LED chip 112 having a double-sided electrode structure.

In light-emitting device 10e, LED chip 112c has a double-sided electrode structure in which the lower electrode is electrically connected to second wire 18b and the upper electrode is connected to one end of bonding wire 17a. The other end of bonding wire 17a is connected to upper electrode 112a of LED chip 112. Specifically, the one end of bonding wire 17a is connected to the upper electrode of LED chip 112c and the other end is connected to upper electrode 112a of LED chip 112.

It should be noted that, in light-emitting device 10e, LED chip 112 is connected to LED chip 112d having a double-sided electrode structure by wire 18c. Specifically, lower electrode 112b of LED chip 112 and the lower electrode of LED chip 112d are connected to wire 18c. In this case, one of lower electrode 112b of LED chip 112 and the lower electrode of LED chip 112d is a cathode and the other is an anode.

In such light-emitting device 10e, electrically connecting the plurality of LED chips is easy even though substrate 11 is a single-layer substrate. It should be noted that, in light-emitting device 10e, the distance between first wire 18a and second wire 18b is determined such that insulation between first wire 18a and second wire 18b is maintained. Furthermore, the distance between first wire 18a and wire 18c is determined such that insulation between first wire 18a and wire 18c is maintained.

It should be noted that each of LED chip 112, LED chip 112c, and LED chip 112d which have a double-sided structure may be an LED chip that emits blue light or may be an LED chip that emits red light.

[Advantageous Effects, etc.]

As described above, light-emitting device 10 includes: substrate 11; first light-emitting element row 12a disposed on substrate 11; first wire 18a disposed on substrate 11 and passing between two LED chips 12 adjacent in first light-emitting element row 12a; and first bonding wire 17a which has one end connected to one of the two LED chips 12 and another end connected to the other of the two LED chips 12, and crosses over the first wire. LED chips 12 are examples of light-emitting elements, and bonding wire 17a is an example of a first bonding wire. The two LED chips 12 are for example LED chip 12a1 and LED chip 12a2.

Accordingly, electrically connecting the plurality of LED chips 12 becomes easy even though substrate 11 is a single-layer substrate. In other words, light-emitting device 10 in which electrically connecting the plurality of LED chips 12 is easy is realized. Furthermore, in light-emitting device 10, first wire 18a and bonding wire 17a are prevented from coming close to each other, and thus maintaining insulation between first wire 18a and bonding wire 17a is easy.

Furthermore, light-emitting device 10 may further include bonding wire 17b having one end connected to LED chip 12 located at an endmost position among the plurality of LED chips 12 included in first light-emitting element row 12a, and another end connected to second wire 18b disposed on substrate 11. In a plan view, bonding wire 17b may be shorter than bonding wire 17a. Bonding wire 17b is an example of a second bonding wire. LED chip 12 located at the endmost position among the plurality of LED chips 12 is, for example, LED chip 12a1.

Accordingly, when first light-emitting element row 12a, including bonding wire 17b, is sealed by first sealant 13a, the area formed at the end portion of first sealant 13a in which brightness is insufficient can be reduced.

Furthermore, each of the two LED chips 12 may have a double-sided electrode structure. Specifically, each of the two LED chips 12 may have first face 12d1 facing substrate 11, second face 12e1 on the side opposite to first face 12d1, and anode 12f and cathode 12g disposed on second face 12e1. The one end of bonding wire 17a may be connected to cathode 12g of one of the two LED chips 12 (for example, LED chip 12a1), and the other end of bonding wire 17a may be connected to anode 12f of the other of the two LED chips 12 (for example, LED chip 12a2).

Accordingly, it becomes easy to maintain insulation between first, wire 18a and bonding wire 17a which connects two LED chips 12 having a double-sided electrode structure.

Furthermore, as in light-emitting device 10d, one of the two LED chips 12 may have a single-sided electrode structure, and the other of the two LED chips 12 may have a double-sided electrode structure.

Accordingly, by electrically connecting LED chip 12 having a single-sided electrode structure and LED chip 12 having a double-sided electrode structure using bonding wire 17a, electrically connecting the plurality of LED chips 12 becomes easy.

Furthermore, as in light-emitting device 10e, each of the two LED chips 12 may have a double-sided electrode structure.

Accordingly, by electrically connecting LED chips 12 having a double-sided electrode structure using bonding wire 17a, electrically connecting the plurality of LED chips 12 becomes easy.

Furthermore, one of the two LED chips 12 (for example, LED chip 12a1) may be located at an endmost position in first-light emitting element row 12a, and the other of the two LED chips 12 (for example, LED chip 12a2) may be located at a second endmost position in the first-light emitting element row.

Accordingly, in light-emitting device 10, deterioration of light-extraction efficiency is reduced further than in a light-emitting device in which the two LED chips 12 connected by bonding wire 17a which crosses over first wire 18a are located at the center portion of the light-emitting element row.

Furthermore, portion P of bonding wire 17a having a greatest height from a surface of substrate 11 may be located closer to the one of the two LED chips 12 (for example, LED chip 12a1). First wire 18a may be located between the two LED chips 12, at a position closer to the one of the two LED chips 12.

Accordingly, since the distance from first wire 18a to bonding wire 17a is balanced, insulation can be effectively maintained.

Furthermore, light-emitting device 10 may further include second light-emitting element row 12b and third light-emitting element row 12c which are disposed on substrate 11. First-light emitting element row 12a may be located between second light-emitting element row 12b and third light-emitting element row 12c, and first wire 18a may electrically connect the second light-emitting element row and the third light-emitting element row.

Accordingly, it becomes easy to maintain insulation between bonding wire 17a and first wire 18a which electrically connects second light-emitting element row 12b and third light-emitting element row 12c.

Furthermore, first-light emitting element row 12a, second light-emitting element row 12b, and third light-emitting element row 12c may each include a plurality of LED chips 12 disposed in a straight line along a first direction. The first direction is, for example, the X-axis direction in Embodiment 1.

Accordingly, it becomes easy to maintain insulation between bonding wire 17a and first wire 18a which electrically connects the linear second light-emitting element row 12b and the linear third light-emitting element row 12c.

Furthermore, first-light emitting element row 12a, second light-emitting element row 12b, and third light-emitting element row 12c may be disposed side by side in a second direction crossing the first direction. The second direction is, for example, the Y-axis direction in Embodiment 1.

Accordingly, it becomes easy to maintain insulation between bonding wire 17a and first wire 18a which electrically connects the linear second light-emitting element row 12b and the linear third light-emitting element row 12c.

Furthermore, light-emitting device 10 may further include first sealant 13a that seals first-light emitting element row 12a in a straight line along the first direction, and second sealant 13b that seals each of second light-emitting element row 12b and third light-emitting element row 12c in a straight line along the first direction.

Accordingly, first light-emitting element row 12a, second light-emitting element row 12b, and third light-emitting element row 12c can be protected.

Furthermore, first sealant 13a and second sealant 13b may each contain a phosphor. First sealant 13a may emit white light of a first color temperature when first-light emitting element row 12a emits light, and second sealant 13b may emit white light of a second color temperature different from the first color temperature, when either one of second light-emitting element row 12b or third light-emitting element row 12c emits light.

Accordingly, by performing light emission control independently on first light-emitting element row 12a, second light-emitting element row 12b, and third light-emitting element row 12c, toning of light-emitting device 10 becomes possible.

Furthermore, light-emitting device 10b may further include sealant 13 that collectively seals first-light emitting element row 12a, second light-emitting element row 12b, and third light-emitting element row 12c.

Accordingly, first light-emitting element row 12a, second light-emitting element row 12b, and third light-emitting element row 12c can be protected.

Embodiment 2

Figure 11:
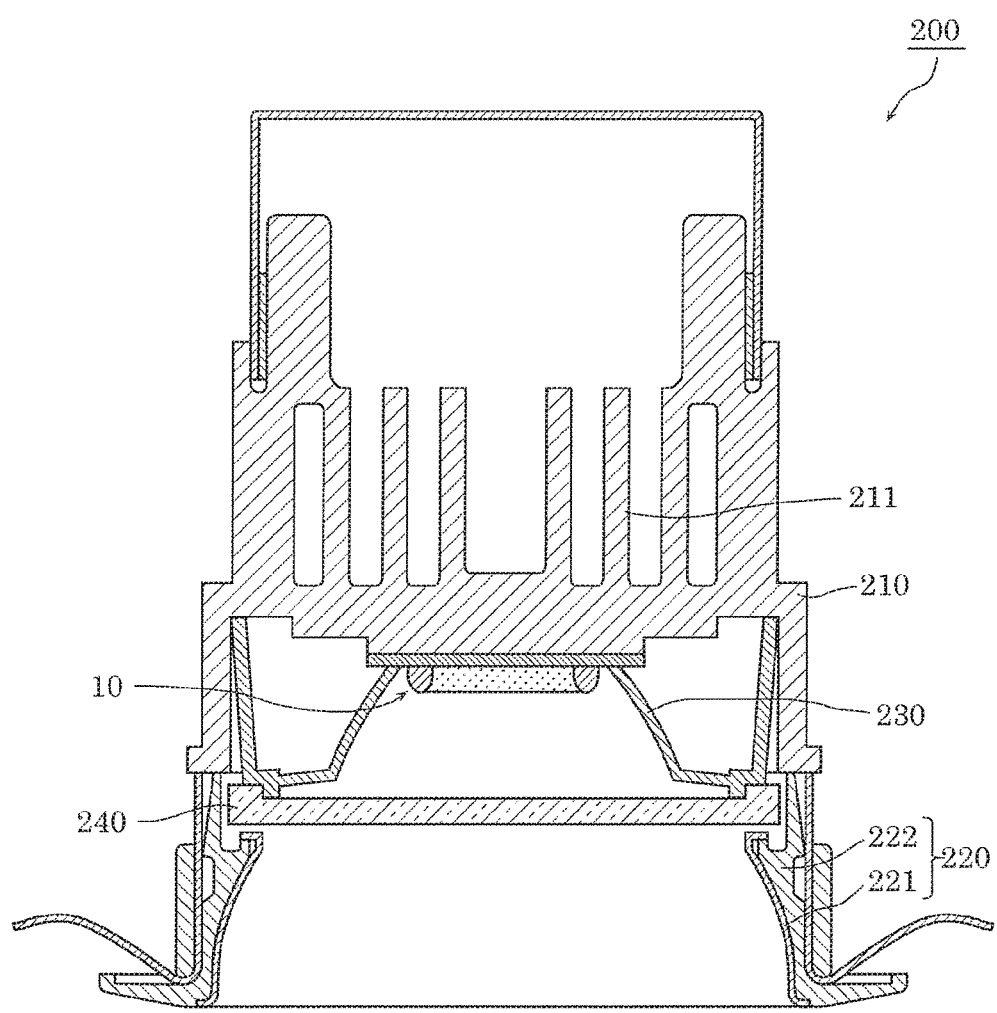
FIG. 11 is a cross-sectional view of an illuminating apparatus according to Embodiment 2.
Figure 12:
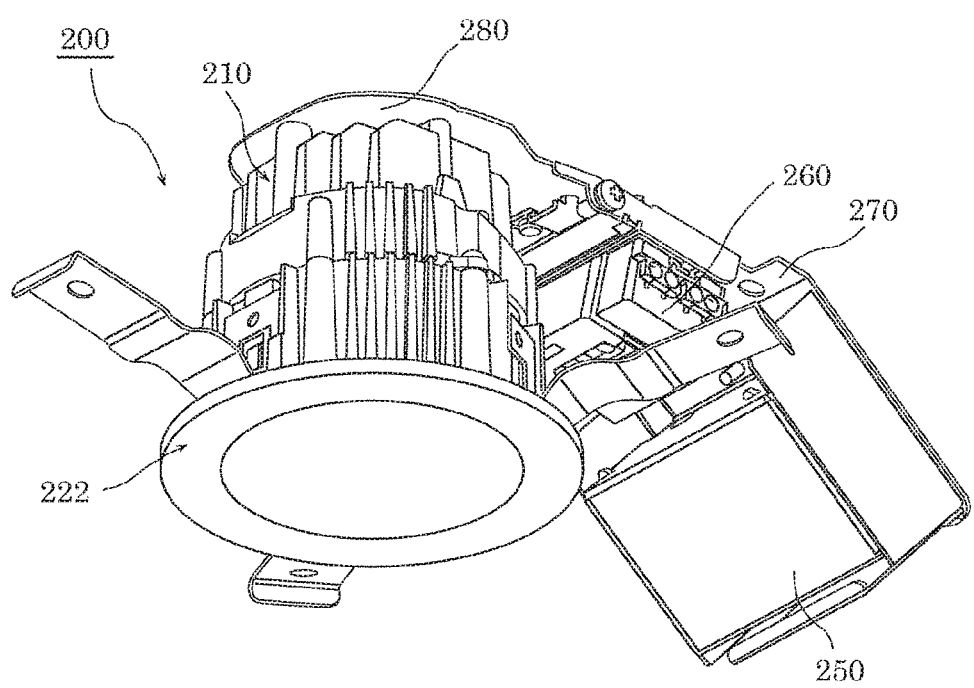
FIG. 12 is an external perspective view of the illuminating apparatus and peripheral components thereof according to Embodiment 2.

Next, an illuminating apparatus according to Embodiment 2 will be described using FIG. 11 and FIG. 12. FIG. 11 is a cross-sectional view of the illuminating apparatus according to Embodiment 2. FIG. 12 is an external perspective view of the illuminating apparatus and peripheral components thereof according to Embodiment 2.

As illustrated in FIG. 11 and FIG. 12, illuminating apparatus 200 according to Embodiment 2 is, for example, a recessed illuminating apparatus such as a downlight that is set by being recessed into the ceiling of a house, and emits light downward (illuminates a corridor, a wall, etc.).

Illuminating apparatus 200 includes light-emitting device 10. Illuminating apparatus 200 further includes: a substantially cylindrical, bottomed apparatus body formed by joining base 210 and frame 220; and reflector 230 and light-transmissive panel 240 which are disposed in the apparatus body.

Base 210 is an attachment base to which light-emitting device 10 is attached, and is a heat sink that dissipates the heat generated by light-emitting device 10. Base 210 is formed in a substantially columnar shape using a metal material, and is formed from die-cast aluminum in Embodiment 2.

A plurality of heat-dissipating fins 211 projecting upward are provided on the top portion (ceiling-side portion) of base 210, at regular intervals along one direction. With this, the heat generated by light-emitting device 10 can be efficiently dissipated.

Frame 220 includes cone 221 which is substantially cylindrical and has a reflecting face in an inner surface, and frame body 222 to which cone 221 is attached. Cone 221 is formed from a metal material, and can be fabricated, for example, by drawing or press-forming an aluminum alloy, etc. Frame body 222 is formed from a rigid resin material or a metal material. Frame 220 is fixed by attaching frame body 222 to base 210.

Reflector 230 is an annular frame-shaped (funnel-shaped) reflecting component, the inner surface of which having a reflecting function. Reflector 230 can be formed from a metal material such as aluminum. It should be noted that reflector 230 may be formed from a rigid white resin material instead of a metal material.

Light-transmissive panel 240 is a light-transmissive component having a light-diffusing property and a light-transmissive property. Light-transmissive panel 240 is a flat plate disposed between reflector 230 and frame 220, and is attached to reflector 230. Light-transmissive panel 240 can be formed in the shape of a disc using a transparent resin material such as acrylic, polycarbonate, etc.

It should be noted that illuminating apparatus 200 need not include light-transmissive panel 240. By not including light-transmissive panel 240, the luminous flux of the light emitted from illuminating apparatus 200 can be improved.

Furthermore, as illustrated in FIG. 12, in illuminating apparatus 200, lighting device 250 and terminal base 260 are connected to light-emitting device 10. Lighting device 250 supplies power for causing light-emitting device 10 to light up, and terminal base 260 relays alternating current power from a commercial power supply to lighting device 250. Specifically, lighting device 250 converts the alternating current power relayed from terminal base 260 into direct current power, and outputs the direct current power to light-emitting device 10. Furthermore, lighting device 250 includes a controller that controls the direct current voltage to be supplied between first terminal 16a and second terminal 16b and the direct current voltage to be supplied to first terminal 16a and third terminal 16c independently of each other. The controller is realized a microcomputer, a processor, or a circuit, etc.

Lighting device 250 and terminal base 260 are fixed to attaching board 270 which is provided separately from the apparatus body. Attaching board 270 is formed by bending a rectangular board-like component comprising a metal material. Lighting device 250 is fixed to the bottom surface of one end portion in the lengthwise direction of attaching board 270, and terminal base 260 is fixed to the bottom surface of the other end portion in the lengthwise direction of attaching board 270. Attaching board 270 and top board 280, which is fixed to the top portion of base 210 of the apparatus body, are linked to each other.

As described above, illuminating apparatus 200 includes light-emitting device 10 and lighting device 250 which supplies light-emitting device 10 with power for causing light-emitting device 10 to light-up. In such illuminating apparatus 200, electrically connecting the plurality of LED chips 12 in light-emitting device 10 also becomes easy. Furthermore, first wire 18a and bonding wire 17a are prevented from coming close to each other, and thus maintaining insulation between first wire 18a and bonding wire 17a becomes easy. It should be noted that illuminating apparatus 200 may include light-emitting device 10b in place of light-emitting device 10.

It should be noted that although a downlight is given as an example of an illuminating apparatus in Embodiment 2, the present invention may be realized as another illuminating apparatus such as a spotlight, etc.

Other Embodiments

Although a light-emitting device and an illuminating apparatus according to exemplary embodiments have been described thus far, the present invention is not limited to the foregoing exemplary embodiments.

Although, in the foregoing exemplary embodiments, the light-emitting device discharges white light through a combination of LED chips emitting blue light and a green phosphor and a red phosphor, the configuration for discharging white light is not limited to such.

For example, LED chips emitting blue light and a red phosphor and a yellow phosphor may be combined. Specifically, the sealant may contain a red phosphor and a yellow phosphor. Alternatively, ultraviolet light-emitting ultraviolet LED chips which have a shorter wavelength than blue light-emitting LED chips and a blue phosphor, a green phosphor, and a red phosphor which emit blue light, green light, and red light when excited by mainly ultraviolet light may be combined. Specifically, the LED chips may emit ultraviolet light, and each of the first sealant and the second sealant may contain a blue phosphor, a green phosphor, and a red phosphor.

Furthermore, the light-emitting device may emit light of a color other than white. For example, when the light-emitting device emits blue light, the sealant need not contain phosphor.

Furthermore, in the foregoing exemplary embodiments, an LED chip is given as an example of a light-emitting element used in the light-emitting device. However, a semiconductor light-emitting element such as a semiconductor laser or a solid-state light-emitting element such as an organic electroluminescent (EL) element or an inorganic EL element may be employed as a light-emitting element.

Forms obtained by various modifications to the respective exemplary embodiments that can be conceived by a person of skill in the art as well as forms realized by arbitrarily combining structural components and functions in the respective exemplary embodiments that are within the scope of the essence of the present invention are included in the present invention.

What is claimed is:

1. A light-emitting device, comprising:
   a substrate;
   a first light-emitting element row disposed on the substrate;
   a first wire disposed on the substrate and passing between two light-emitting elements adjacent in the first light-emitting element row; and
   a first bonding wire having one end connected to one of the two light emitting elements and another end connected to the other of the two light-emitting elements, the first bonding wire crossing over the first wire.

2. The light-emitting device according to claim 1, further comprising:
   a second bonding wire having one end connected to a light-emitting element located at an endmost position among a plurality of light-emitting elements included in the first light-emitting element row, and another end connected to a second wire disposed on the substrate, wherein
   in a plan view, the second bonding wire is shorter than the first bonding wire.

3. The light-emitting device according to claim 1, wherein the two light-emitting elements each have a single-sided electrode structure.

4. The light-emitting device according to claim 3, wherein the two light-emitting elements each have a first face facing the substrate, a second face on a side opposite to the first face, and an anode and a cathode which are disposed on the second face, and
   the one end of the first bonding wire is connected to the cathode of one of the two light-emitting elements, and the other end of the first bonding wire is connected to the anode of the other of the two light-emitting elements.

5. The light-emitting device according to claim 1, wherein one of the two light-emitting elements has a single-sided electrode structure, and
   the other of the two light-emitting elements has a double-sided electrode structure.

6. The light-emitting device according to claim 1, wherein the two light-emitting elements each have a double-sided electrode structure.

7. The light-emitting device according to claim 1, wherein one of the two light-emitting elements is located at an endmost position in the first-light emitting element row, and
   the other of the two light-emitting elements is located at a second endmost position in the first-light emitting element row.

8. The light-emitting device according to claim 1, wherein a portion of the first bonding wire having a greatest height from a surface of the substrate is located closer to the one of the two light-emitting elements, and
   the first wire is located between the two light-emitting elements, at a position closer to the one of the two light-emitting elements.

9. The light-emitting device according to claim 1, further comprising:
   a second light-emitting element row and a third light-emitting element row which are disposed on the substrate, wherein
   the first-light emitting element row is located between the second light-emitting element row and the third light-emitting element row, and
   the first wire electrically connects the second light-emitting element row and the third light-emitting element row.

10. The light-emitting device according to claim 9, wherein
    the first-light emitting element row, the second light-emitting element row, and the third light-emitting element row each include a plurality of light-emitting elements disposed in a straight line along a first direction.

11. The light-emitting device according to claim 10, wherein the first-light emitting element row, the second light-emitting element row, and the third light-emitting element row are disposed side by side in a second direction crossing the first direction.

12. The light-emitting device according to claim 10, further comprising:

a first sealant that seals the first-light emitting element row in a straight line along the first direction; and a second sealant that seals each of the second light-emitting element row and the third light-emitting element row in a straight line along the first direction.

13. The light-emitting device according to claim 12, wherein the first sealant and the second sealant each contain a phosphor, the first sealant emits white light of a first color temperature when the first-light emitting element row emits light, and the second sealant emits white light of a second color temperature different from the first color temperature, when either one of the second light-emitting element row or the third light-emitting element row emits light.

14. The light-emitting device according to claim 10, further comprising:

a sealant that collectively seals the first-light emitting element row, the second light-emitting element row, and the third light-emitting element row.

15. The light-emitting device according to claim 14, wherein the sealant contains a phosphor and emits white light when either one of the second light-emitting element row or the third light-emitting element row emits light.

16. The light-emitting device according to claim 14, further comprising:

an annular component surrounding the sealant.

17. The light-emitting device according to claim 9, further comprising:

a first terminal, a second terminal, and a third terminal which are disposed on the substrate, wherein the first-light emitting element row emits light when power is supplied between the first terminal and the second terminal, and the second light-emitting element row and the third light-emitting element row emit light when power is supplied between the first terminal and the third terminal.

18. The light-emitting device according to claim 17, wherein the substrate has a rectangular shape in a plan view, and the first terminal, the second terminal, and the third terminal are disposed in three out of four corners of the substrate.

19. The light-emitting device according to claim 1, wherein wherein the substrate has an elongated shape in a plan view, and the first-light emitting element row is disposed on the substrate, along a lengthwise direction of the substrate.

20. An illuminating apparatus, comprising:

the light-emitting device according to claim 1; and a lighting device that supplies power for causing the light-emitting device to emit light.

* * * * *